United States Patent
Torimi et al.

(10) Patent No.: US 9,725,822 B2
(45) Date of Patent: Aug. 8, 2017

(54) METHOD FOR EPITAXIAL GROWTH OF MONOCRYSTALLINE SILICON CARBIDE USING A FEED MATERIAL INCLUDING A SURFACE LAYER CONTAINING A POLYCRYSTALLINE SILICON CARBIDE WITH A 3C CRYSTAL POLYMORPH

(75) Inventors: Satoshi Torimi, Kanonji (JP); Satoru Nogami, Kanonji (JP); Tsuyoshi Matsumoto, Kanonji (JP)

(73) Assignee: TOYO TANSO CO., LTD., Osaka (JP)

( * ) Notice: Subject to any disclaimer, the term of this patent is extended or adjusted under 35 U.S.C. 154(b) by 1086 days.

(21) Appl. No.: 13/995,722

(22) PCT Filed: Jun. 29, 2011

(86) PCT No.: PCT/JP2011/064877
§ 371 (c)(1),
(2), (4) Date: Jun. 19, 2013

(87) PCT Pub. No.: WO2012/086239
PCT Pub. Date: Jun. 28, 2012

(65) Prior Publication Data
US 2013/0269596 A1  Oct. 17, 2013

(30) Foreign Application Priority Data

Dec. 24, 2010  (JP) ................................. 2010-288468
Dec. 24, 2010  (JP) ................................. 2010-288471
(Continued)

(51) Int. Cl.
*C30B 19/12* (2006.01)
*C30B 19/00* (2006.01)
(Continued)

(52) U.S. Cl.
CPC .............. *C30B 19/12* (2013.01); *C30B 19/00* (2013.01); *C30B 28/12* (2013.01); *C30B 29/36* (2013.01); *Y10T 428/26* (2015.01)

(58) Field of Classification Search
CPC ......... C30B 19/00; C30B 19/08; C30B 19/10; C30B 19/12; C30B 28/00; C30B 28/04; C30B 29/00; C30B 29/10; C30B 29/36
(Continued)

(56) References Cited

U.S. PATENT DOCUMENTS 5,879,450 A  3/1999 Lee et al.
6,936,102 B1  8/2005 Otsuki et al.
(Continued)

FOREIGN PATENT DOCUMENTS

EP  1 403 404 A1  3/2004
JP  2000-160343 A  6/2000
(Continued)

OTHER PUBLICATIONS

V.C. George, et al. publication entitled "Bias enhanced deposition of highly oriented b-SiC thin films using low pressure hot filament chemical vapour deposition technique," Thin Solid Films, vol. 419, pp. 114-117 (2002).*
(Continued)

*Primary Examiner* — Kenneth A Bratland, Jr.
(74) *Attorney, Agent, or Firm* — Keating and Bennett, LLP

(57) ABSTRACT

Provided is a feed material for epitaxial growth of a monocrystalline silicon carbide capable of increasing the rate of epitaxial growth of silicon carbide. A feed material 11 for epitaxial growth of a monocrystalline silicon carbide includes a surface layer containing a polycrystalline silicon carbide with a 3C crystal polymorph. Upon X-ray diffraction of the surface layer, a diffraction peak corresponding to a
(Continued)

(111) crystal plane and a diffraction peak other than the diffraction peak corresponding to the (111) crystal plane are observed as diffraction peaks corresponding to the polycrystalline silicon carbide with a 3C crystal polymorph.

17 Claims, 8 Drawing Sheets

(30) Foreign Application Priority Data

Dec. 24, 2010 (JP) .................................. 2010-288474
Dec. 24, 2010 (JP) .................................. 2010-288478

(51) Int. Cl.
*C30B 29/36* (2006.01)
*C30B 28/12* (2006.01)

(58) Field of Classification Search
USPC ..... 117/11–12, 53–55, 58, 63, 73, 902, 937, 117/951
See application file for complete search history.

(56) References Cited

U.S. PATENT DOCUMENTS

| | | | |
|---|---|---|---|
| 2004/0237879 A1 | 12/2004 | Kaneko et al. | |
| 2006/0011131 A1* | 1/2006 | Otsuki | C23C 16/325 117/98 |
| 2006/0249073 A1* | 11/2006 | Asaoka | C30B 19/00 117/84 |
| 2009/0038538 A1 | 2/2009 | Kaneko et al. | |

FOREIGN PATENT DOCUMENTS

| | | |
|---|---|---|
| JP | 2005-97040 A | 4/2005 |
| JP | 2008-37684 A | 2/2008 |
| JP | 2008-230946 A | 10/2008 |
| JP | 2009-188117 A | 8/2009 |
| TW | I232891 B | 5/2005 |

OTHER PUBLICATIONS

Official Communication issued in corresponding European Patent Application No. 11 851 354.8, mailed on May 31, 2016.
Ohmukai, M. et al., "Characteristics of Amorphous Silicon Precipitated by Means of Argon Excimer Laser Irridation on SiC Films", Journal of Non-Crystalline Solids, vol. 202, No. 1-2, Jul. 1996, pp. 77-80.
Official Communication issued in corresponding European Patent Application No. 11851354.8, mailed on Jun. 5, 2014.
English translation of Official Communication issued in corresponding International Application PCT/JP2011/064877, mailed on Jul. 11, 2013.
Official Communication issued in International Patent Application No. PCT/JP2011/064877, mailed on Aug. 16, 2011.
Nishitani et al., "Metastable solvent epitaxy of SiC", Journal of Crystal Growth, vol. 310, 2008, pp. 1815-1818.
Iwanowski et al., "CPS and XRD study of crystalline 3C—SiC grown by sublimation method", Journal of Alloys and Compounds, vol. 286, 1999, pp. 143-147.
Jeong et al., "Raman scattering studies of polycrystalline 3C—SiC deposited on SiO2 and AlN thin films", Physica B, vol. 404, 2009, pp. 7-10.

* cited by examiner

METHOD FOR EPITAXIAL GROWTH OF MONOCRYSTALLINE SILICON CARBIDE USING A FEED MATERIAL INCLUDING A SURFACE LAYER CONTAINING A POLYCRYSTALLINE SILICON CARBIDE WITH A 3C CRYSTAL POLYMORPH

TECHNICAL FIELD

This invention relates to a feed material for epitaxial growth of a monocrystalline silicon carbide and a method for epitaxial growth of a monocrystalline silicon carbide using the same.

BACKGROUND ART

Silicon carbide (SiC) is considered to be capable of achieving high-temperature resistance, high voltage resistance, high-frequency resistance, and high environment resistance each of which could not be achieved by conventional semiconductor materials, such as silicon (Si) and gallium arsenide (GaAs). Therefore, silicon carbide is expected as a semiconductor material for next-generation power devices and a semiconductor material for high-frequency devices.

The seeded sublimation growth method (modified Lely method) is conventionally proposed as a method for growing a monocrystalline silicon carbide, such as for example in Patent Literature 1 below. In this modified Lely method, a seed material made of a monocrystalline silicon carbide is placed in a low-temperature zone of a crucible and a powder of source material containing Si as a source material is placed in a high-temperature zone thereof. Then, the interior of the crucible is brought into an inert atmosphere and heated to a high temperature of 1450° C. to 2400° C. to sublimate the powder of source material placed in the high-temperature zone. As a result, silicon carbide can be epitaxially grown on the surface of the seed material placed in the low-temperature zone.

Nevertheless, the modified Lely method is a method of growing silicon carbide crystals by providing a temperature gradient in the vapor phase. Therefore, in the case of using the modified Lely method, a large apparatus is required for epitaxial growth of silicon carbide and the process for epitaxial growth of silicon carbide is difficult to control. This presents a problem of rise in cost of producing a silicon carbide epitaxial growth film. In addition, epitaxial growth of silicon carbide in the vapor phase is nonequilibrium. Therefore, crystal defects are likely to occur in the silicon carbide epitaxial growth film being formed and there also arises a problem of ease of roughening of the crystal structure.

An example of a method for epitaxial growth of silicon carbide other than the modified Lely method is metastable solvent epitaxy (MSE) which is a method of epitaxially growing silicon carbide in the liquid phase, as proposed for example in Patent Literature 2.

In MSE, a seed material made of a crystalline silicon carbide, such as a monocrystalline silicon carbide or a polycrystalline silicon carbide, and a feed material made of silicon carbide are faced each other at a distance as small as, for example, 100 μm or less and a Si melt layer is interposed between them. Then, these materials are subjected to heating treatment in a vacuum, high-temperature environment to epitaxially grow silicon carbide on the surface of the seed material.

It is considered that in MSE a difference in chemical potential between the seed material and the feed material causes dissolution of carbon in the Si melt layer and a concentration gradient of carbon in the Si melt layer and thus a silicon carbide epitaxial growth film is formed. Therefore, unlike the case of using the modified Lely method, there is not necessarily a need to provide a temperature difference between the seed material and the feed material. Hence, with the use of MSE, not only the process for epitaxial growth of silicon carbide can be easily controlled with a simple apparatus but also a high-quality silicon carbide epitaxial growth film can be stably formed.

In addition, MSE also has the advantage of being capable of forming a silicon carbide epitaxial growth film even on a large-area seed substrate and the advantage of lowering the temperature for the process of epitaxially growing silicon carbide because the extremely small thickness of the Si melt layer facilitates the diffusion of carbon from the feed material.

Accordingly, MSE is considered to be an extremely useful method as the method for epitaxial growth of a monocrystalline silicon carbide and active research on MSE has been carried out.

CITATION LIST

Patent Literature

Patent Literature 1: JP-A-2005-97040
Patent Literature 2: JP-A-2008-230946

SUMMARY OF INVENTION

Technical Problem

As described above, it is considered that in MSE the feed material and the seed material should be selected so that the feed material has a higher free energy than the seed material. Therefore, for example, Patent Literature 2 above describes that a feed substrate and a seed substrate are made different from each other in free energy by making the feed substrate and the seed substrate different in crystal polymorph. More specifically, the literature describes that if the feed substrate is formed of a polycrystalline 3C—SiC substrate, the seed substrate is formed such as of a monocrystalline 4H—SiC substrate having a lower free energy than the 3C—SiC substrate.

In this relation, a polycrystalline 3C—SiC substrate can be easily produced by CVD. Therefore, as described in Patent Literature 2, the use of a 3C—SiC substrate as the feed substrate enables a low cost of formation of a silicon carbide epitaxial growth film. For this reason, the inventors have conducted studies on the use of 3C—SiC substrates as the feed substrate. As a result, they have found that among 3C—SiC substrates there are those having a high rate of epitaxial growth of silicon carbide and those having a low rate of epitaxial growth of silicon carbide.

The present invention has been made in view of the foregoing points and an object thereof is to provide a feed material for epitaxial growth of a monocrystalline silicon carbide capable of increasing the rate of epitaxial growth of silicon carbide.

Solution to Problem

The inventors have found through intensive studies that the rate of epitaxial growth in the case of using a feed material with a 3C crystal polymorph correlates with diffraction peaks observed by X-ray diffraction of the feed material. Concretely speaking, the inventors have found that feed materials in which a diffraction peak other than a diffraction peak corresponding to the (111) crystal plane is observed as a diffraction peak corresponding to a polycrystalline silicon carbide with a 3C crystal polymorph are higher in rate of epitaxial growth than feed materials in which no diffraction peak other than a diffraction peak corresponding to the (111) crystal plane is observed as a diffraction peak corresponding to the polycrystalline silicon carbide. Furthermore, the inventors have found that the stronger the peak intensity of the diffraction peak other than the diffraction peak corresponding to the (111) crystal plane, the higher the rate of epitaxial growth. As a result, the inventors have led to the accomplishment of the invention.

Specifically, a feed material for epitaxial growth of a monocrystalline silicon carbide according to the present invention is a feed material used in a method for epitaxial growth of a monocrystalline silicon carbide. The feed material for epitaxial growth of a monocrystalline silicon carbide according to the present invention includes a surface layer containing a polycrystalline silicon carbide with a 3C crystal polymorph. Upon X-ray diffraction of the surface layer, a diffraction peak corresponding to a (111) crystal plane and a diffraction peak other than the diffraction peak corresponding to the (111) crystal plane are observed as diffraction peaks corresponding to the polycrystalline silicon carbide with a 3C crystal polymorph. Therefore, with the use of the feed material according to the present invention, the rate of epitaxial growth of a monocrystalline silicon carbide can be increased.

The reason why the rate of epitaxial growth of a monocrystalline silicon carbide can be increased when a diffraction peak other than the diffraction peak corresponding to the (111) crystal plane is observed can be that crystal planes other than the (111) crystal plane has higher reactivity than the (111) crystal plane. For example, in performing liquid phase epitaxial growth of a monocrystalline silicon carbide, crystal planes other than the (111) crystal plane are more likely to be eluted than the (111) crystal plane. Therefore, it can be considered that by the use of a feed material in which a diffraction peak other than the diffraction peak corresponding to the (111) crystal plane is observed, the rate of epitaxial growth of a monocrystalline silicon carbide can be increased.

The term "method for epitaxial growth" in the present invention includes methods for liquid phase epitaxial growth, such as metastable solvent epitaxy (MSE), and methods for vapor phase epitaxial growth, such as the modified Lely method. The term "MSE" refers to a method in which the seed material and the feed material are heated in a position facing each other with a silicon melt layer therebetween to form a concentration gradient of dissolved graphite in the silicon melt layer and a monocrystalline silicon carbide is epitaxially grown on the seed material using the concentration gradient.

The term "X-ray diffraction" in the present invention refers to diffraction using 8.048 keV X-rays (CuKα rays).

The expression "diffraction peak is observed" in the present invention means that a diffraction peak having a peak intensity of 3% or more of the peak intensity of a first-order diffraction peak corresponding to the (111) crystal plane is observed.

The term "diffraction peak corresponding to the (111) crystal plane" in the present invention includes first-order and higher-order diffraction peaks corresponding to the (111) crystal plane.

The term "feed material" in the present invention refers to a material capable of feeding ingredients for epitaxial growth of a monocrystalline silicon carbide, such for example as Si, C, and SiC. On the other hand, the term "seed material" refers to a material on the surface of which a monocrystalline silicon carbide can grow.

In the present invention, the first-order diffraction peak corresponding to the (111) crystal plane is preferably a main diffraction peak having the highest diffraction intensity among first-order diffraction peaks corresponding to the polycrystalline silicon carbide with a 3C crystal polymorph.

In the present invention, the diffraction peak other than the diffraction peak corresponding to the (111) crystal plane preferably includes at least one diffraction peak, each diffraction peak corresponding to one of a (200) crystal plane, a (220) crystal plane, and a (311) crystal plane. With this structure, the rate of epitaxial growth of the monocrystalline silicon carbide can be more effectively increased. The reason for this can be that the (200) crystal plane, the (220) crystal plane, and the (311) crystal plane have higher reactivity than the (111) crystal plane. From the viewpoint of still more effectively increasing the rate of epitaxial growth of the monocrystalline silicon carbide, the diffraction peak other than the diffraction peak corresponding to the (111) crystal plane more preferably includes diffraction peaks, each corresponding to one of the (200) crystal plane, the (220) crystal plane, and the (311) crystal plane.

In the present invention, the sum of the intensities of first-order diffraction peaks other than the first-order diffraction peak corresponding to the (111) crystal plane is preferably 10% or more of the sum of the intensities of all the first-order diffraction peaks and more preferably 20% or more thereof. With this structure, the proportion of the crystal planes other than the (111) crystal plane and having higher reactivity than the (111) crystal plane can be further increased. Therefore, the rate of epitaxial growth of the monocrystalline silicon carbide can be more effectively increased.

Furthermore, in the present invention, the average crystallite diameter calculated from the first-order diffraction peak observed by X-ray diffraction of the surface layer and corresponding to the polycrystalline silicon carbide with a 3C crystal polymorph is 700 A or less. With this structure, the rate of epitaxial growth of the monocrystalline silicon carbide can be still more effectively increased. The reason for this can be that the surface layer is increased in proportion of high-reactivity grain boundaries of polycrystalline silicon carbide crystals, which further increases the reactivity of the surface layer.

Furthermore, upon X-ray diffraction of the surface layer, a first-order diffraction peak corresponding to the (111) crystal plane and at least one first-order diffraction peak each corresponding to one of the (200) crystal plane, the (220) crystal plane, and the (311) crystal plane are observed and $(I_1/I_0)^{-1} \cdot D^2$ is equal to or smaller than $10^8$, where:

$I_0$ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;

$I_1$ represents the total intensity of the at least one first-order diffraction peak each corresponding to one of the (200) crystal plane, the (220) crystal plane, and the (311) crystal plane; and D represents the average crystallite diameter calculated from the at least one first-order diffraction peak each corresponding to one of the (200) crystal plane, the (220) crystal plane, and the (311) crystal plane.

With this structure, the rate of epitaxial growth of the monocrystalline silicon carbide can be still more effectively increased. The reason for this can be that the proportion of (200), (220), and (311) crystal planes having relatively high reactivity is increased and the average crystallite diameter is decreased.

The term "crystallite diameter" in the present invention refers to the crystallite diameter calculated based on the Hall's equation shown in the following formula (1):

$$\beta \cdot (\cos \theta)/\lambda = 2\eta \cdot (\sin \theta)/\lambda + 1/\epsilon \quad (1)$$

where:

$\beta$ represents the full width at half-maximum;

$\theta$ represents the Bragg angle of the diffraction line;

$\lambda$ represents the wavelength of X-ray used for measurement;

$\eta$ represents the value of inhomogeneous strain of the crystal; and $\epsilon$ represents the average crystallite diameter.

In the present invention, the proportion of (111) crystal planes having an orientation angle of 67.5° or more in the (111) crystal planes observed by X-ray diffraction of the surface layer is preferably less than 80%. With this structure, the rate of epitaxial growth of the monocrystalline silicon carbide can be still more effectively increased. The reason for this can be that the degree of exposure of crystal planes having lower stability than the (111) crystal plane in the crystals having (111) crystal planes exposed is increased, which makes it possible to increase the reactivity of the crystals having (111) crystal planes exposed.

Furthermore, it is preferred that an LO peak derived from a polycrystalline silicon carbide with a 3C crystal polymorph be observed upon Raman spectroscopic analysis of the surface layer with an excitation wavelength of 532 nm and the absolute amount of shift of the LO peak from 972 $cm^{-1}$ be less than 4 $cm^{-1}$. In this case, the rate of epitaxial growth of the monocrystalline silicon carbide can be still further increased.

The reason why the rate of epitaxial growth of the monocrystalline silicon carbide can be increased when the absolute amount of shift of the LO peak from 972 $cm^{-1}$ is less than 4 $cm^{-1}$ can be that when the absolute amount of shift of the LO peak from the 972 $cm^{-1}$ is small, the internal stress in the surface layer of the feed material is small and therefore the denseness of the surface layer is low, which makes it likely to cause the elution from the surface layer.

The term "LO peak derived from a polycrystalline silicon carbide" in the present invention refers to a peak which is derived from the longitudinal optical mode among optical modes of oscillation between the two atoms of Si—C in the silicon carbide crystal and generally, in the case of a 3C polymorph, appears at 972 $cm^{-1}$.

In the present invention, the full width at half-maximum of the LO peak is preferably 7 $cm^{-1}$ or more. With the use of the feed material having this structure, the rate of epitaxial growth of the monocrystalline silicon carbide can be still further increased.

The reason why the rate of epitaxial growth of the monocrystalline silicon carbide can be further increased when the full width at half-maximum of the LO peak is 7 $cm^{-1}$ or more can be that larger full widths at half-maximum of the LO peak can be caused by lower degrees of crystallinity or higher impurity concentrations of the polycrystalline silicon carbide in the surface layer, which makes it more likely to cause the elution from the surface layer.

In the present invention, the surface layer preferably contains a polycrystalline silicon carbide with a 3C crystal polymorph as a major ingredient and is preferably substantially made of the polycrystalline silicon carbide with a 3C crystal polymorph. With this structure, the rate of epitaxial growth of the monocrystalline silicon carbide can be still more effectively increased.

The term "major ingredient" in the present invention refers to an ingredient which is contained in a proportion of 50% by mass or more in the surface layer.

The expression "substantially made of the polycrystalline silicon carbide with a 3C crystal polymorph" means that the surface layer contains no ingredient other than the polycrystalline silicon carbide with a 3C crystal polymorph, except for impurities. The content of impurities in the surface layer when "substantially made of the polycrystalline silicon carbide with a 3C crystal polymorph" is generally 5% by mass or less.

The feed material for epitaxial growth of a monocrystalline silicon carbide according to the present invention may include a support member and a polycrystalline silicon carbide film formed on the support member and forming the surface layer. In this case, the polycrystalline silicon carbide film preferably has a thickness within a range of 30 µm to 800 µm.

The feed material for epitaxial growth of a monocrystalline silicon carbide according to the present invention may be formed of a polycrystalline silicon carbide material, such as a polycrystalline silicon carbide substrate containing a polycrystalline silicon carbide with a 3C crystal polymorph.

In a method for epitaxial growth of a monocrystalline silicon carbide according to the present invention, epitaxial growth of a monocrystalline silicon carbide is performed using the above feed material for epitaxial growth of a monocrystalline silicon carbide according to the present invention. Therefore, the monocrystalline silicon carbide can be epitaxially grown at a high rate.

In the method for epitaxial growth of a monocrystalline silicon carbide according to the present invention, it is preferred that the feed material and a seed material including a surface layer containing silicon carbide be heated with the surface layers of the feed material and the seed material facing each other through a silicon melt layer to epitaxially grow a monocrystalline silicon carbide on the surface layer of the seed material. In other words, the method for epitaxial growth of a monocrystalline silicon carbide according to the present invention is preferably a method for liquid phase epitaxial growth of a monocrystalline silicon carbide. In this case, there is not necessarily a need to provide a temperature difference between the seed material and the feed material. Therefore, not only the process for epitaxial growth of a monocrystalline silicon carbide can be easily controlled with a simple apparatus but also a high-quality monocrystalline silicon carbide epitaxial growth film can be stably formed.

Advantageous Effects of Invention

The present invention can provide a feed material for epitaxial growth of a monocrystalline silicon carbide capable of increasing the rate of epitaxial growth of a monocrystalline silicon carbide.

DESCRIPTION OF EMBODIMENTS

A description will be given below of an example of a preferred embodiment for working of the present invention. However, the following embodiment is simply illustrative. The present invention is not at all limited by the following embodiment.

Figure 1:
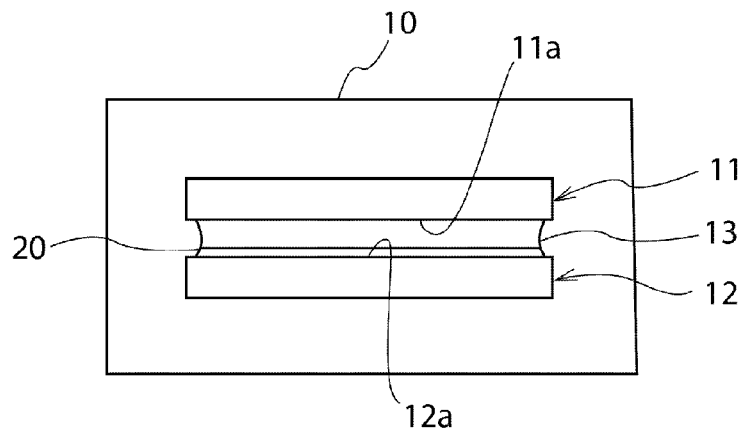
FIG. 1 is a schematic view for illustrating a method for epitaxial growth of a monocrystalline silicon carbide in one embodiment of the present invention.

FIG. 1 is a schematic view for illustrating a method for epitaxial growth of a monocrystalline silicon carbide in this embodiment.

The embodiment describes an example in which an epitaxial growth film of a monocrystalline silicon carbide is formed using MSE.

In this embodiment, as shown in FIG. 1, a seed substrate 12 as the seed material and a feed substrate 11 as the feed material are arranged in a vessel 10 so that a principal surface 12a of the seed substrate 12 and a principal surface 11a of the feed substrate 11 face each other with a silicon plate therebetween. In this position, the seed substrate 12 and the feed substrate 11 are heated to melt the silicon plate. Thus, the seed substrate 12 and the feed substrate 11 are faced each other with a silicon melt layer 13 therebetween. By keeping this state, source materials including silicon, carbon, and silicon carbide are eluted from the feed substrate 12 into the silicon melt layer 13. Thus, a concentration gradient is formed in the silicon melt layer 13. As a result, a monocrystalline silicon carbide epitaxially grows on the principal surface 12a of the seed substrate 12, resulting in the formation of a monocrystalline silicon carbide epitaxial growth film 20. The thickness of the silicon melt layer 13 is extremely small and can be, for example, about 10 μm to about 100 μm.

(Feed Substrate 11)

Figure 2:
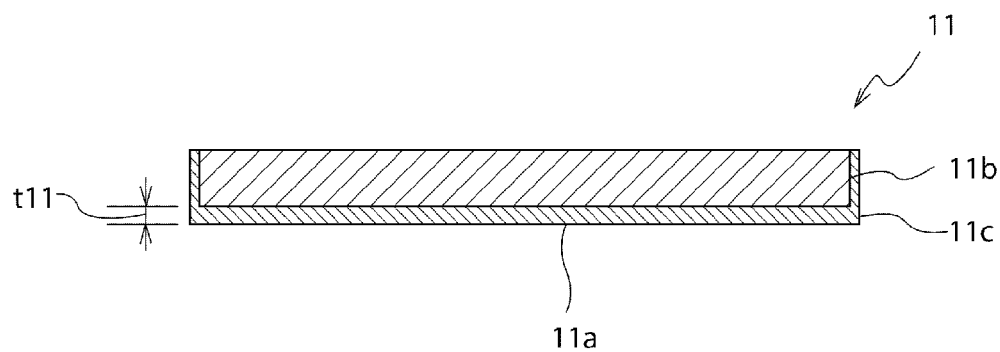
FIG. 2 is a schematic cross-sectional view of a feed substrate in the one embodiment of the present invention.

FIG. 2 shows a schematic cross-sectional view of the feed substrate 11. The feed substrate 11 includes a surface layer containing a polycrystalline silicon carbide with a 3C crystal polymorph. Specifically, in this embodiment, the feed substrate 11 includes a graphite-made support member 11b and a polycrystalline silicon carbide film 11c. The graphite-made support member 11b has high thermal resistance so that it can sufficiently withstand the process for epitaxial growth of silicon carbide. Furthermore, the graphite-made support member 11b has a coefficient of thermal expansion similar to that of the monocrystalline silicon carbide epitaxial growth film 20. Therefore, with the use of the graphite-made support member 11b, the silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 11b is a production method described in JP-A-2005-132711.

The polycrystalline silicon carbide film 11c is formed to cover the principal and side surfaces of the support member 11b. The polycrystalline silicon carbide film 11c contains a polycrystalline silicon carbide. The surface layer of the feed substrate 11 is formed of the polycrystalline silicon carbide film 11c. The polycrystalline silicon carbide film 11c preferably contains a polycrystalline silicon carbide with a 3C crystal polymorph (hereinafter referred to as "polycrystalline 3C—SiC") as a major ingredient and is preferably substantially made of polycrystalline 3C—SiC. In other words, the surface layer of the feed substrate 11 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

The thickness t11 of the polycrystalline silicon carbide film 11c is preferably within a range of 30 μm to 800 μm, more preferably within a range of 40 μm to 600 μm, and still more preferably within a range of 100 μm to 300 μm. If the thickness t11 of the polycrystalline silicon carbide film 11c is too small, the graphite-made support member 11b may be exposed during the formation of a monocrystalline silicon carbide epitaxial growth film 20, thus causing elution from the support member 11b and resulting in failure to obtain a suitable monocrystalline silicon carbide epitaxial growth film 20. On the other hand, if the thickness t11 of the polycrystalline silicon carbide film 11c is too large, the polycrystalline silicon carbide film 11c may be likely to produce cracks.

No particular limitation is placed on the method for forming the polycrystalline silicon carbide film 11c. The polycrystalline silicon carbide film 11c can be formed, for example, by CVD (chemical vapor deposition) or sputtering. Particularly in this embodiment, since the polycrystalline silicon carbide film 11c contains polycrystalline 3C—SiC, a dense polycrystalline silicon carbide film 11c can be formed with ease at low cost by CVD.

The polycrystalline silicon carbide film 11c forming the surface layer of the feed substrate 11 is such that when it is subjected to X-ray diffraction, a diffraction peak corresponding to the (111) crystal plane and a diffraction peak other than the diffraction peak corresponding to the (111) crystal plane are observed as diffraction peaks corresponding to a crystal polymorph of polycrystalline 3C—SiC.

Diffraction peaks corresponding to a crystal polymorph of polycrystalline 3C—SiC include, as also shown in Table 1 below, a diffraction peak corresponding to the (111) crystal plane, a diffraction peak corresponding to the (200) crystal plane, a diffraction peak corresponding to the (220) crystal plane, and a diffraction peak corresponding to a diffraction peak corresponding to the (311) crystal plane. Therefore, more specifically, the polycrystalline silicon carbide film 11c is such that when it is subjected to X-ray diffraction, a diffraction peak corresponding to the (111) crystal plane and at least one diffraction peak each corresponding to one of the (200) crystal plane, the (220) crystal plane, and the (311) crystal plane are observed as diffraction peaks corresponding to a crystal polymorph of polycrystalline 3C—SiC. Therefore, in this embodiment, the monocrystalline silicon carbide epitaxial growth film 20 can be formed at a high rate of growth. A possible reason for this is that the crystal planes other than the (111) crystal plane are more likely to cause the elution into the silicon melt layer 13 than the (111) crystal plane.

TABLE 1

| Corresponding Crystal Plane | 2 θ (°) |
|---|---|
| (111) | 35.6 |
| (200) | 41.4 |
| (220) | 60.0 |
| (311) | 71.7 |

The polycrystalline silicon carbide film 11c is such that when subjected to X-ray diffraction, in addition to a diffraction peak corresponding to the (111) crystal plane, at least one diffraction peak each corresponding to one of the (200) crystal plane, the (220) crystal plane, and the (311) crystal plane is preferably observed as a diffraction peak corresponding to a crystal polymorph of polycrystalline 3C—SiC and, more preferably, diffraction peaks each corresponding to one of the (200) crystal plane, the (220) crystal plane, and the (311) crystal plane are observed. In this case, the rate of growth of the monocrystalline silicon carbide epitaxial growth film 20 can be further increased. The reason for this can be that, among the crystal planes other than the (111) crystal plane, the (200) crystal plane, the (220) crystal plane, and the (311) crystal plane have particularly high reactivity and thus are more likely to cause elution into the silicon melt layer 13.

Moreover, the sum of the intensities of first-order diffraction peaks other than the first-order diffraction peak corresponding to the (111) crystal plane is preferably 10% or more of the sum of the intensities of all the first-order diffraction peaks and more preferably 20% or more thereof. In this case, the rate of growth of the monocrystalline silicon carbide epitaxial growth film 20 can be still further increased.

Among a plurality of first-order diffraction peaks observed as diffraction peaks corresponding to a crystal polymorph of polycrystalline 3C—SiC when the polycrystalline silicon carbide film 11c is subjected to X-ray diffraction, a first-order diffraction peak corresponding to the (111) crystal plane is preferably a main diffraction peak having the highest diffraction intensity. In this case, the diffraction peak intensity ratio of the (200) plane of silicon carbide to the (111) plane thereof ((200) plane/(111) plane) is preferably within a range of 0.1 to 0.6.

Furthermore, the polycrystalline silicon carbide film 11c is preferably such that the average crystallite diameter calculated from the first-order diffraction peak observed by X-ray diffraction and corresponding to the polycrystalline silicon carbide with a 3C crystal polymorph is 700 Å or less. In this case, the rate of growth of the monocrystalline silicon carbide epitaxial growth film 20 can be still further increased. The reason for this can be that the polycrystalline silicon carbide film 11c is increased in proportion of high-reactivity grain boundaries of polycrystalline silicon carbide crystals, which makes it more likely to cause the elution from the polycrystalline silicon carbide film 11c.

Furthermore, the polycrystalline silicon carbide film 11c is preferably such that when subjected to X-ray diffraction, a first-order diffraction peak corresponding to the (111) crystal plane and at least one first-order diffraction peak each corresponding to one of the (200) crystal plane, the (220) crystal plane, and the (311) crystal plane are observed and $(I_1/I_0)^{-1} \cdot D^2$ is equal to or smaller than $10^8$, where:

$I_0$ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;

$I_1$ represents the total intensity of the at least one first-order diffraction peak each corresponding to one of the (200) crystal plane, the (220) crystal plane, and the (311) crystal plane; and D represents the average crystallite diameter calculated using the Hall's equation from the at least one first-order diffraction peak each corresponding to one of the (200) crystal plane, the (220) crystal plane, and the (311) crystal plane.

In this case, the rate of growth of the monocrystalline silicon carbide epitaxial growth film 20 can be still more effectively increased. The reason for this can be that the polycrystalline silicon carbide film 11c is increased in proportion of (200), (220), and (311) crystal planes having relatively high reactivity and is decreased in average crystallite diameter.

Moreover, the polycrystalline silicon carbide film 11c is preferably such that the proportion of (111) crystal planes having an orientation angle of 67.5° or more in the (111) crystal planes observed by X-ray diffraction is less than 80%. In this case, the rate of growth of the monocrystalline silicon carbide epitaxial growth film 20 can be still more effectively increased. The reason for this can be that the degree of exposure of crystal planes having lower stability than the (111) crystal plane in the crystals having (111) crystal planes exposed is increased, which makes it possible to increase the reactivity of the crystals having (111) crystal planes exposed.

Furthermore, when the polycrystalline silicon carbide film 11c forming the surface layer of the feed substrate 11 of this embodiment is subjected to Raman spectroscopic analysis with an excitation wavelength of 532 nm, an LO peak derived from a polycrystalline silicon carbide with a 3C crystal polymorph is observed. Moreover, the absolute amount of shift of the observed LO peak from 972 cm$^{-1}$ is less than 4 cm$^{-1}$. Therefore, in this embodiment, a further increased rate of epitaxial growth of the monocrystalline silicon carbide can be achieved. The reason for this can be that when the absolute amount of shift of the LO peak from the 972 cm$^{-1}$ is small, the internal stress in the surface layer of the feed material is small and therefore the denseness of the surface layer is low, which makes it likely to cause the elution from the surface layer.

Furthermore, the full width at half-maximum of the LO peak is preferably 7 cm$^{-1}$ or more. In this case, the rate of epitaxial growth of the monocrystalline silicon carbide can be still further increased. The reason for this can be that larger full widths at half-maximum of the LO peak can be caused by lower degrees of crystallinity or higher impurity concentrations of the polycrystalline silicon carbide in the surface layer, which makes it more likely to cause the elution from the surface layer.

(Seed Substrate 12)

No particular limitation is placed on the material of the seed substrate 12 so long as its surface layer on the principal surface 12a side is made of silicon carbide and it is less likely to be eluted into the silicon melt layer 13 than the feed substrate 11. The seed substrate 12 may be, for example, such that the surface layer is made of a monocrystalline silicon carbide or made of a silicon carbide with a 4H or 6H crystal polymorph. Furthermore, the seed substrate 12 may be, for example, such that the surface layer thereof contains a polycrystalline silicon carbide with a 3C crystal polymorph and upon X-ray diffraction of the surface layer a first-order diffraction peak corresponding to a (111) crystal plane is observed as a diffraction peak corresponding to the polycrystalline silicon carbide with a 3C crystal polymorph but no other first-order diffraction peak having a diffraction intensity of 10% or more of the diffraction intensity of the first-order diffraction peak corresponding to the (111) crystal plane is observed. In this case, the seed substrate 12 can be produced at a lower cost by CVD. Therefore, the cost of forming a monocrystalline silicon carbide epitaxial growth film 20 can be reduced.

The seed substrate 12 may also be, for example, such that the surface layer thereof includes a polycrystalline silicon carbide with a 3C crystal polymorph, an LO peak derived from the polycrystalline silicon carbide with a 3C crystal polymorph is observed upon Raman spectroscopic analysis of the surface layer with an excitation wavelength of 532 nm, and the absolute amount of shift of the LO peak from 972 cm$^{-1}$ is 4 cm$^{-1}$ or more. In this case, the seed substrate 12 can be produced at a lower cost by CVD. Therefore, the cost of forming a monocrystalline silicon carbide epitaxial growth film 20 can be reduced.

Figure 3:
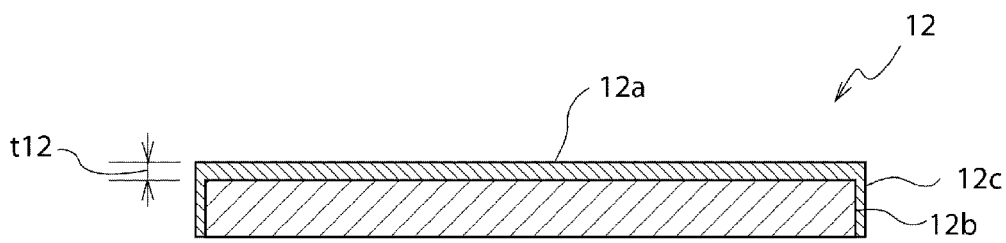
FIG. 3 is a schematic cross-sectional view of a seed substrate in the one embodiment of the present invention.

Hereinafter, this embodiment describes an example in which the seed substrate 12 shown in FIG. 3 is used. In this embodiment, as shown in FIG. 3, the seed substrate 12 includes a graphite-made support member 12b and a polycrystalline silicon carbide film 12c. The graphite-made support member 12b has high thermal resistance so that it can sufficiently withstand the process for epitaxial growth of silicon carbide. Furthermore, the graphite-made support member 12b has a coefficient of thermal expansion similar to that of the monocrystalline silicon carbide epitaxial growth film 20. Therefore, with the use of the graphite-made support member 12b, the silicon carbide epitaxial growth film 20 can be suitably formed.

Specific examples of graphite include natural graphite, artificial graphite, petroleum coke, coal coke, pitch coke, carbon black, and mesocarbon. An example of a method for producing the graphite-made support member 12b is a production method described in JP-A-2005-132711.

The polycrystalline silicon carbide film 12c is formed to cover the principal and side surfaces of the support member 12b. The polycrystalline silicon carbide film 12c contains a polycrystalline silicon carbide. The surface layer of the seed substrate 12 is formed of the polycrystalline silicon carbide film 12c. The polycrystalline silicon carbide film 12c in this embodiment preferably contains polycrystalline 3C—SiC as a major ingredient and is preferably substantially made of polycrystalline 3C—SiC. In other words, in this embodiment, the surface layer of the seed substrate 12 preferably contains polycrystalline 3C—SiC as a major ingredient and is preferably substantially made of polycrystalline 3C—SiC. Thus, the rate of growth of the monocrystalline silicon carbide epitaxial growth film 20 can be increased.

The thickness t12 of the polycrystalline silicon carbide film 12c is preferably within a range of 30 µm to 800 µm, more preferably within a range of 40 µm to 600 µm, and still more preferably within a range of 100 µm to 300 µm. If the thickness t12 of the polycrystalline silicon carbide film 12c is too small, the graphite-made support member 12b may be exposed during the formation of a monocrystalline silicon carbide epitaxial growth film 20, thus causing elution from the support member 12b and resulting in failure to obtain a suitable monocrystalline silicon carbide epitaxial growth film 20. On the other hand, if the thickness t12 of the polycrystalline silicon carbide film 12c is too large, the polycrystalline silicon carbide film 12c may be likely to produce cracks.

No particular limitation is placed on the method for forming the polycrystalline silicon carbide film 12c. The polycrystalline silicon carbide film 12c can be formed, for example, by CVD (chemical vapor deposition) or sputtering. Particularly in this embodiment, since the polycrystalline silicon carbide film 12c contains polycrystalline 3C—SiC, a dense polycrystalline silicon carbide film 12c can be formed with ease at low cost by CVD.

Figure 4:
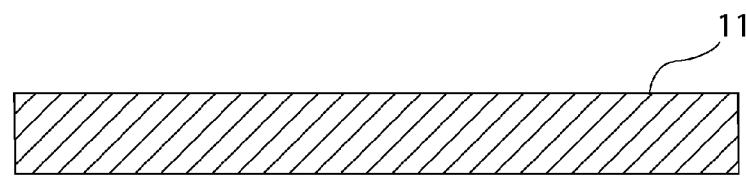
FIG. 4 is a schematic cross-sectional view of a feed substrate in a modification.
Figure 5:
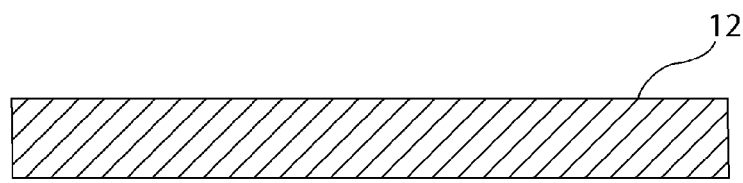
FIG. 5 is a schematic cross-sectional view of a seed substrate in the modification.

The above embodiment has described an example in which each of the feed substrate 11 and the seed substrate 12 is formed of a support member 11b or 12b and a polycrystalline silicon carbide film 11c or 12c. However, the present invention is not limited to the above structure. For example, as shown in FIG. 4, the feed substrate 11 may be formed of a polycrystalline silicon substrate containing a polycrystalline silicon carbide with a 3C crystal polymorph. Furthermore, as shown in FIG. 5, the seed substrate 12 may be formed of a silicon carbide substrate containing silicon carbide.

The silicon carbide substrate can be produced, for example, by coating a graphite base material with a polycrystalline silicon carbide by CDV and then mechanically or chemically removing graphite. Alternatively, the silicon carbide substrate can be produced by reacting a graphite material with silicate gas to convert the graphite material into silicon carbide. Still alternatively, the silicon carbide substrate can be produced by adding a sintering aid to silicon carbide powder and sintering the silicon carbide powder at a high temperature of 1600° C. or above.

The above embodiment has described an example in which a monocrystalline silicon carbide epitaxial growth film is formed by MSE which is a method for liquid phase epitaxial growth of a monocrystalline silicon carbide. However, the present invention is not limited to this. For example, a monocrystalline silicon carbide epitaxial growth film may be formed by a method for vapor phase epitaxial growth, such as the modified Lely method.

The present invention will be further described below with reference to specific examples, but is not at all limited by the following specific examples.

Production Example 1

A graphite material (15 mm by 15 mm by 2 mm) made of high-purity isotropic graphite having a bulk density of 1.85 g/cm³ and an ash content of 5 ppm or less was used as a base material. The base material was put into a CVD reactor and a 30 μm thick polycrystalline silicon carbide coating was formed on the base material by CVD to produce Sample 1. Silicon tetrachloride and propane gas were used as source gases. The deposition was performed at an ordinary pressure and 1200° C. The deposition rate was at 30 μm/h.

Production Example 2

A 50 μm thick polycrystalline silicon carbide coating was formed on the surface of a graphite material in the same manner as in Production Example 1 above except that the reaction temperature was at 1400° C. and the deposition rate was at 60 μm/h, resulting in the production of Sample 2.

Production Example 3

A 50 μm thick polycrystalline silicon carbide coating was formed on the surface of a graphite material in the same manner as in Production Example 1 above except that the reaction temperature was at 1250° C., the deposition rate was at 10 μm/h, and CH₃SiCl₃ was used instead of silicon tetrachloride, resulting in the production of Sample 3.

Production Example 4

A 50 μm thick polycrystalline silicon carbide coating was formed on the surface of a graphite material in the same manner as in Production Example 1 above except that dichlorosilane (SiH₂Cl₂) and acetylene were used instead of silicon tetrachloride and propane gas, the reaction temperature was at 1300° C., and the deposition rate was at 10 μm/h, resulting in the production of Sample 4. In Sample 4, the thickness of the polycrystalline silicon carbide coating was approximately 1 mm.

(X-Ray Diffraction Measurement)

The surface layers of the above produced Samples 1 to 4 were subjected to X-ray diffraction. The X-ray diffraction was performed using Ultima manufactured by Rigaku Corporation. The measurement results are shown in FIG. 6.

Figure 6:
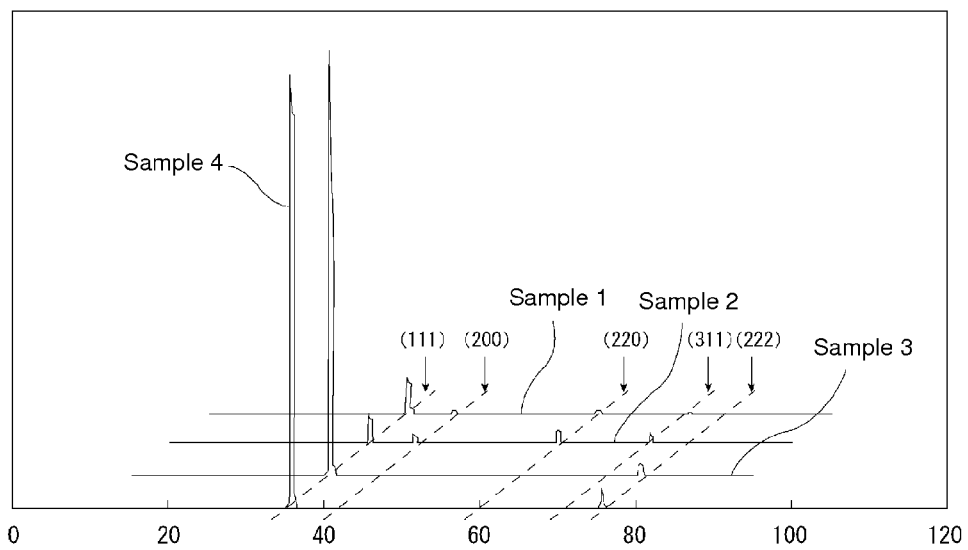
FIG. 6 is an X-ray diffraction chart relating to Samples 1 to 4.

As shown in FIG. 6, in Samples 1 and 2, not only a diffraction peak (2θ=35.6°) corresponding to the (111) crystal plane but also diffraction peaks corresponding to crystal planes other than the (111) crystal plane were observed. Specifically, in Samples 1 and 2, not only a diffraction peak (2θ=35.6°) corresponding to the (111) crystal plane but also a diffraction peak (2θ=41.4°) corresponding to the (200) crystal plane, a diffraction peak (2θ=60.0°) corresponding to the (220) crystal plane, and a diffraction peak (2θ=71.7°) corresponding to the (311) crystal plane were observed.

On the other hand, in Samples 3 and 4, a diffraction peak(2θ=35.6°) corresponding to the (111) crystal plane and a diffraction peak (2θ=75.5°) corresponding to the (222) crystal plane, which is a higher-order diffraction peak of the above diffraction peak, were observed, but no other diffraction peak having an intensity exceeding 3% of the intensity of the diffraction peak corresponding to the (111) crystal plane was observed.

Arranged in Table 2 below are the relative intensities of the first-order diffraction peaks corresponding to various crystal planes in Samples 1 to 4, with 100 representing the intensity of the first-order diffraction peak corresponding to the (111) crystal plane.

TABLE 2

| Corresponding Crystal Plane | Relative Intensity of First-Order Diffraction Peak | | | |
|---|---|---|---|---|
| | Sample 1 | Sample 2 | Sample 3 | Sample 4 |
| (111) | 100 | 100 | 100 | 100 |
| (200) | 13 | 40 | 0 | 0 |
| (220) | 12 | 51 | 0 | 0 |
| (311) | 12 | 47 | 1 | 0 |

(Calculation of Average Crystallite Diameter)

The average crystallite diameters of Samples 1 to 4 were calculated based on the results of the above X-ray diffraction measurement, using the Hall's equation. In the calculation, data of diffraction peaks relating to the (111) crystal plane, the (200) crystal plane, the (220) crystal plane, and the (311) crystal plane were used. The results are shown in Table 3 below.

TABLE 3

| | Average Crystallite Diameter (A) |
|---|---|
| Sample 1 | 350 |
| Sample 2 | 455 |
| Sample 3 | 1136 |
| Sample 4 | 1012 |

As seen from the results shown in Table 3 above, the average crystallite diameters of Samples 1 and 2 were less than 700 A, more specifically, less than 500 A and the average crystallite diameters of Samples 3 and 4 were more than 700 A, more specifically, more than 1000 A.

(Evaluation of Orientation of (111) Crystal Plane)

Figure 7:
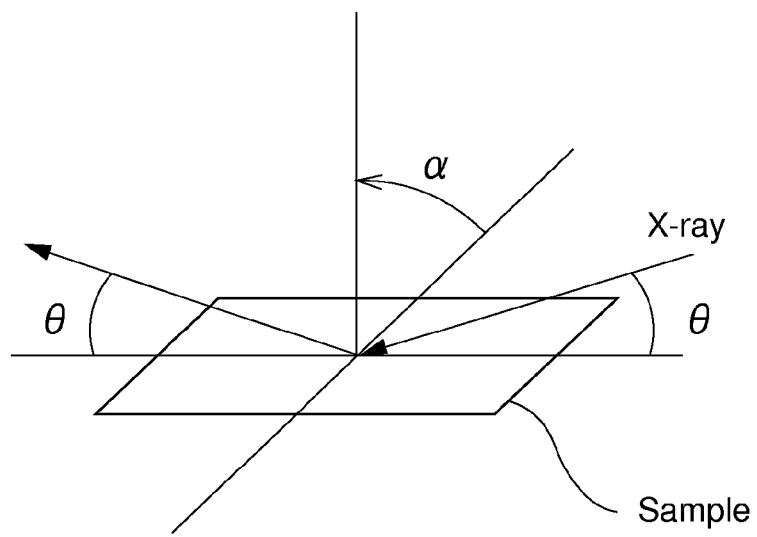
FIG. 7 is a schematic diagram for illustrating a method for measuring the orientation of a (111) crystal plane.

Next, Samples 1 to 4 were measured in terms of angle at which the diffraction peak corresponding to the (111) plane appeared while each of them was rotated as shown in FIG. 7. The results are shown in FIGS. 8 to 11. In the graphs shown in FIGS. 8 to 11, the abscissa represents the orientation angle (α) shown in FIG. 7. The ordinate represents the intensity.

Furthermore, Table 4 below shows the proportion of the intensity integral in a region of 67.5° and higher orientation angles (α) to the intensity integral in an entire region of 15° to 90° orientation angles (α) ((intensity integral in region of 67.5° and higher orientation angles (α))/(intensity integral in entire region of 15° to 90° orientation angles (α)). Note that the ((intensity integral in region of 67.5° and higher orientation angles (α))/(intensity integral in entire region of 15° to 90° orientation angles (α)) corresponds to the proportion of (111) crystal plane having an orientation angle of 67.5° or more in the (111) crystal planes observed by X-ray diffraction.

TABLE 4

| | Proportion of (111) Crystal Planes Having 67.5° or Higher Orientation Angle |
|---|---|
| Sample 1 | 38.6% |
| Sample 2 | 48.5% |
| Sample 3 | 96.5% |
| Sample 4 | 96.9% |

Figure 8:
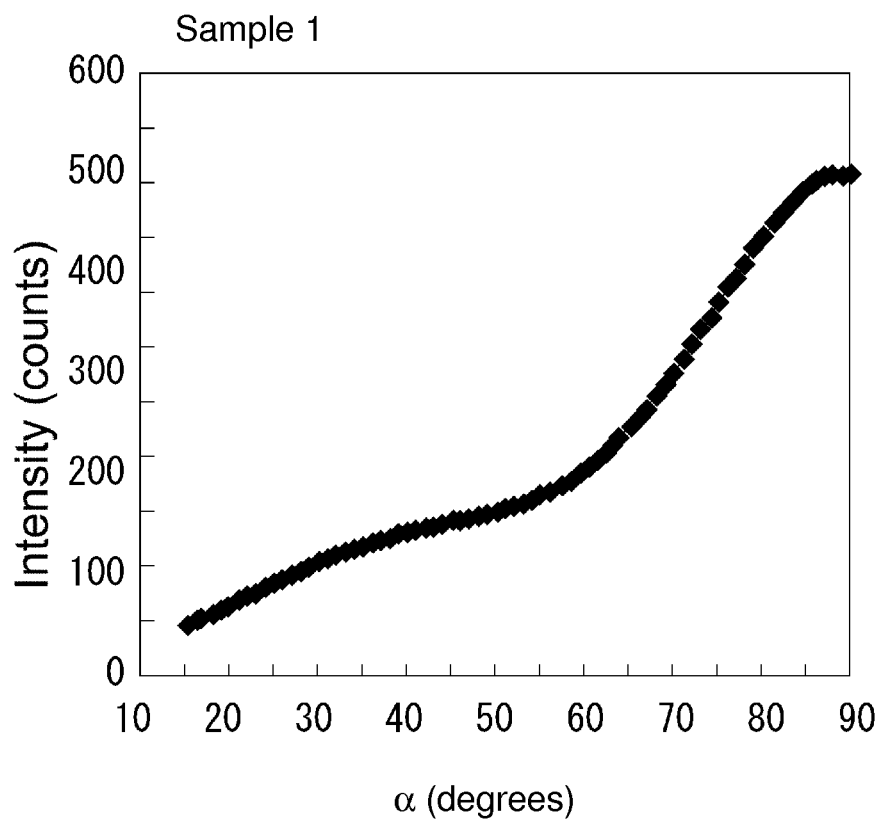
FIG. 8 is a graph showing the orientation of the (111) crystal plane in Sample 1.
Figure 9:
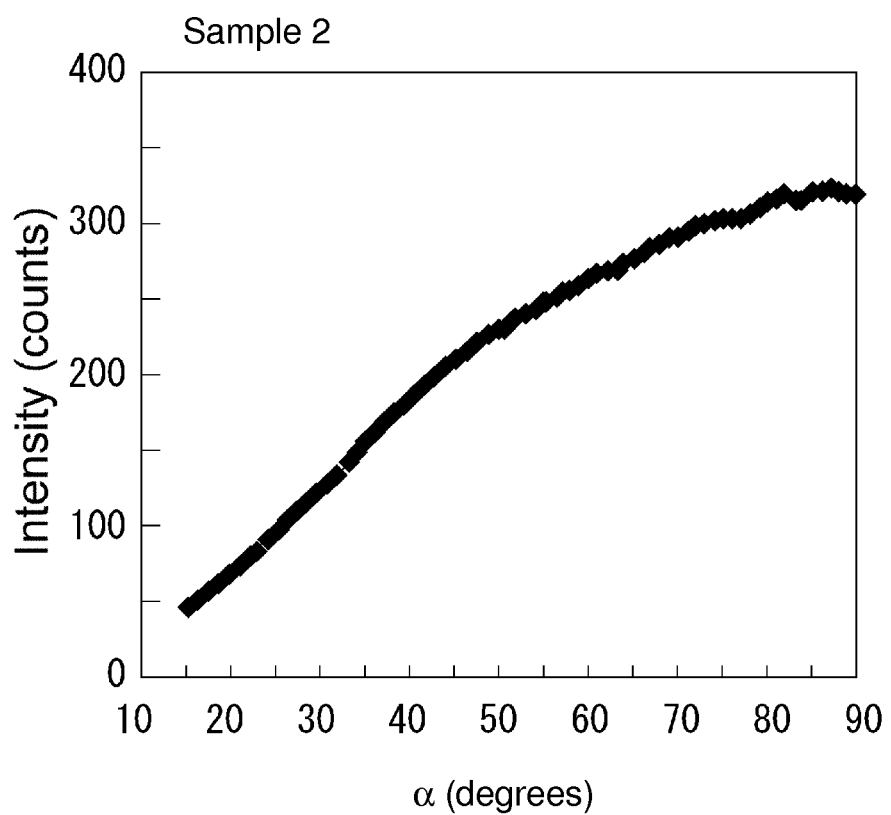
FIG. 9 is a graph showing the orientation of the (111) crystal plane in Sample 2.
Figure 10:
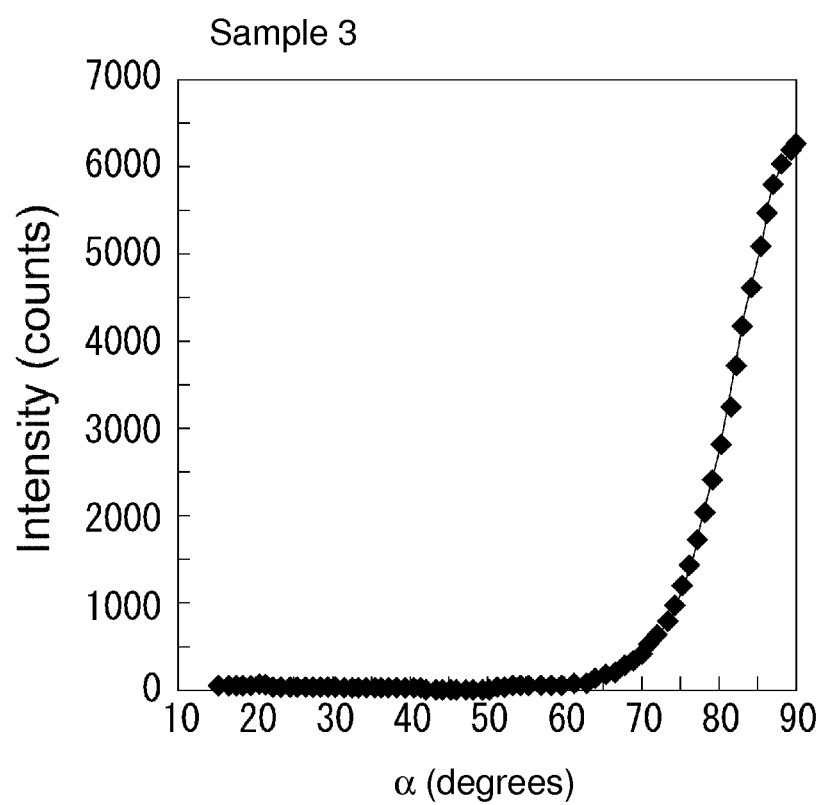
FIG. 10 is a graph showing the orientation of the (111) crystal plane in Sample 3.
Figure 11:
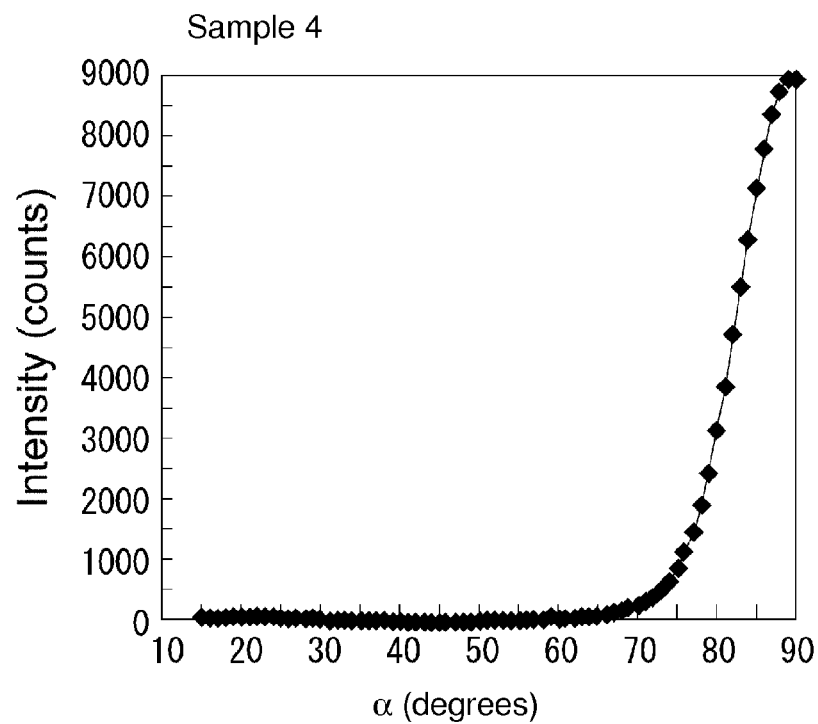
FIG. 11 is a graph showing the orientation of the (111) crystal plane in Sample 4.

As shown in FIGS. 8 and 9 and Table 4 above, in Samples 1 and 2, a wide intensity distribution existed also in a region of orientation angles (α) less than 67.5° and the proportion of (111) crystal planes having an orientation angle (α) of 67.5° or more was less than 80%. On the other hand, in Samples 3 and 4, no wide intensity distribution existed in a region of orientation angles (α) less than 67.5° and the proportion of (111) crystal planes having an orientation angle (α) of 67.5° or more was more than 80%.

(Raman Spectroscopic Analysis)

The surface layers of the above produced Samples 1 to 4 were subjected to Raman spectroscopic analysis. An excitation wavelength of 532 nm was used for the Raman spectroscopic analysis. The measurement results are shown in FIG. 12.

Figure 12:
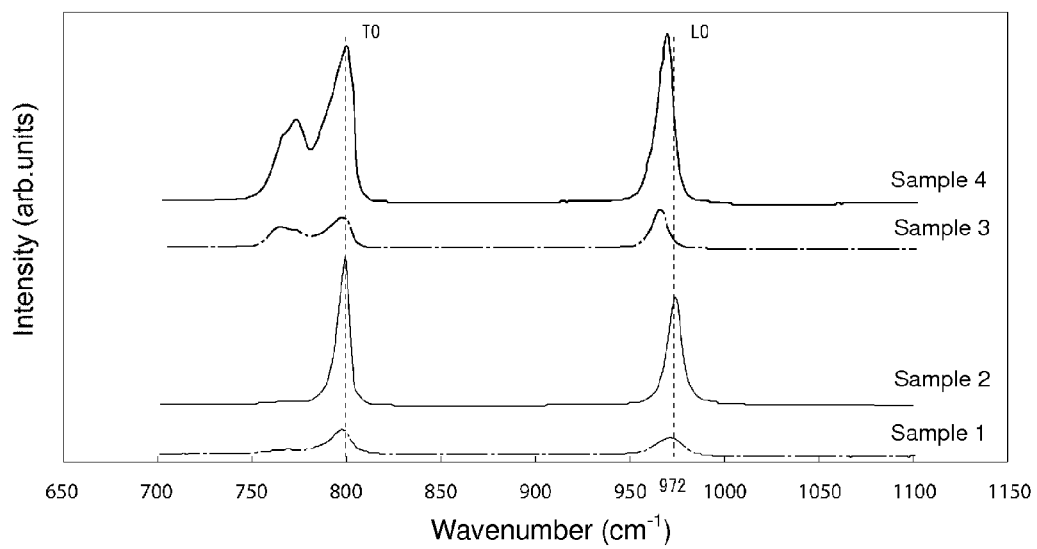
FIG. 12 is a graph showing the results of Raman spectroscopic analysis of the surface layers of Samples 1 to 4.

Next, from the measurement results shown in FIG. 12, the amounts (Δω) of shift of LO peaks from 972 $cm^{-1}$ in Samples 1 to 4 and full widths at half-maximum (FWHM) of the LO peaks were determined. The results are shown in FIG. 13.

Figure 13:
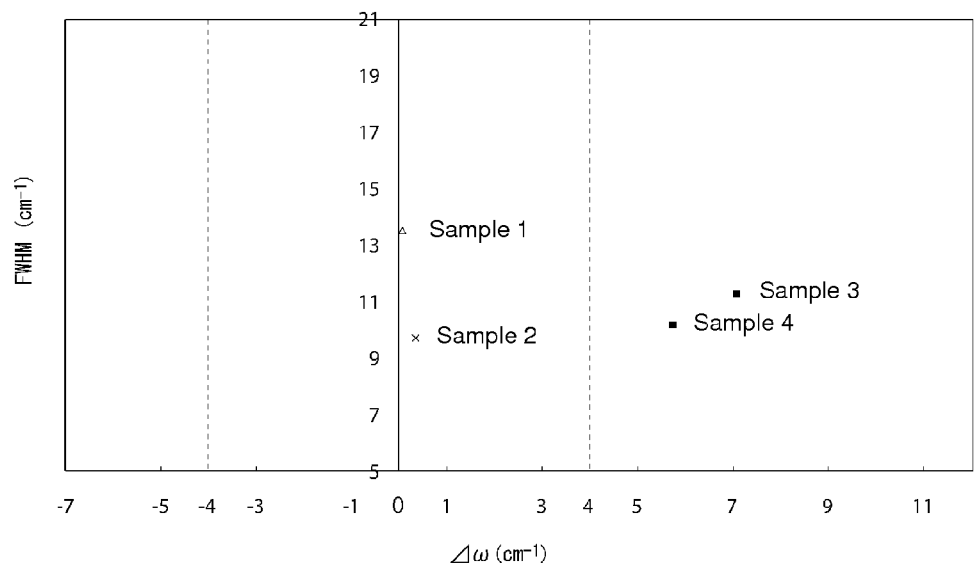
FIG. 13 is a graph showing the amounts ($\Delta\omega$) of shift of LO peaks from 972 $cm^{-1}$ in Samples 1 to 4 and the full widths at half-maximum (FWHM) of the LO peaks.

As shown in FIG. 13, Samples 1 and 2 each had an absolute value of Δω of less than 4 $cm^{-1}$ and an FWHM of more than 7 $cm^{-1}$. On the other hand, Samples 3 and 4 each had an FWHM of more than 7 $cm^{-1}$ like Samples 1 and 2, but their absolute values of Δω were more than 4 $cm^{-1}$.

(Evaluation of Rate of Growth of Monocrystalline Silicon Carbide Liquid Phase Epitaxial Growth Film)

Using Samples 1 to 4 as feed substrates, respective monocrystalline silicon carbide epitaxial growth films 20 were produced under the conditions shown below by the method for liquid phase epitaxial growth described in the above embodiment. Then, the thickness of each of the silicon carbide epitaxial growth films 20 was measured by observing the cross section of the silicon carbide epitaxial growth film 20 with an optical microscope. The rate of growth of each monocrystalline silicon carbide epitaxial growth film 20 was determined by dividing the measured thickness by the time for epitaxial growth of silicon carbide.

Figure 14:
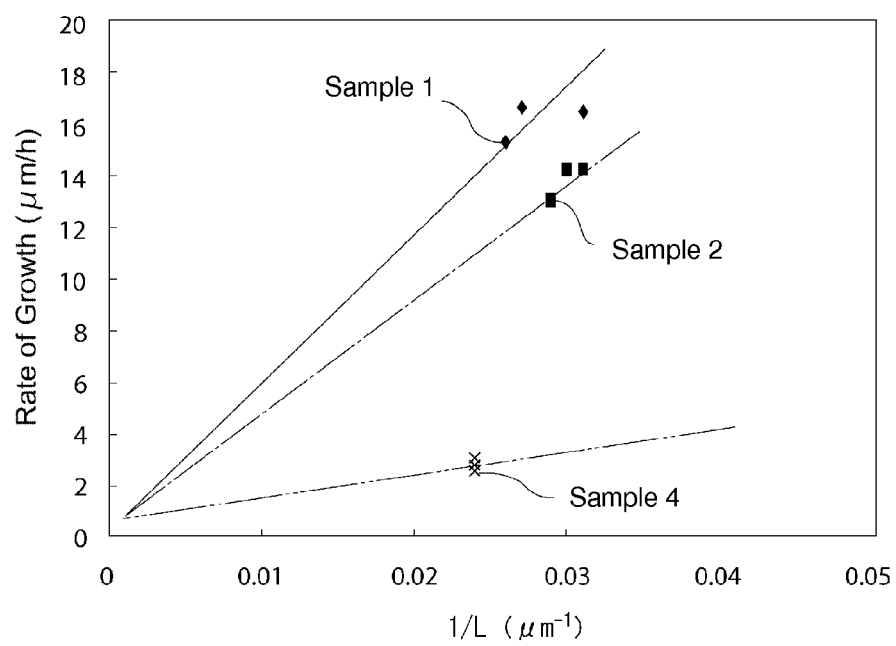
FIG. 14 is a graph showing the rates of growth of monocrystalline silicon carbide epitaxial growth films in Samples 1, 2, and 4.
Figure 15:
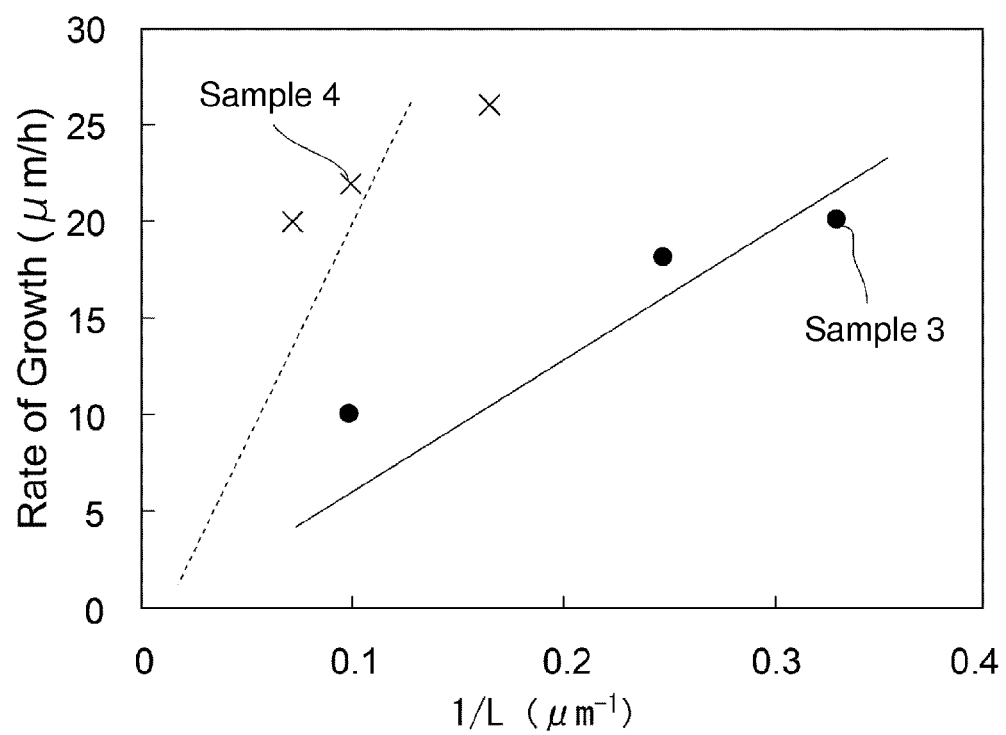
FIG. 15 is a graph showing the rates of growth of monocrystalline silicon carbide epitaxial growth films in Samples 3 and 4.

The results are shown in FIGS. 14 and 15. In FIGS. 14 and 15, the ordinate represents the rate of growth of each monocrystalline silicon carbide epitaxial growth film 20 and the abscissa represents the reciprocal (1/L) of the thickness (L) of the silicon melt layer 13.

As seen from the results shown in FIGS. 14 and 15, in the case of using Samples 1 and 2 in which when the polycrystalline silicon carbide film 11c forming the surface layer of the feed substrate 11 was subjected to X-ray diffraction, not only a diffraction peak corresponding to the (111) crystal plane but also diffraction peaks other than the diffraction peak corresponding to the (111) crystal plane were observed as diffraction peaks corresponding to a crystal polymorph of polycrystalline 3C—SiC, the rate of growth of the monocrystalline silicon carbide epitaxial growth film 20 was high. On the other hand, in the case of using Samples 3 and 4 in which when the polycrystalline silicon carbide film 11c forming the surface layer of the feed substrate 11 was subjected to X-ray diffraction, only diffraction peaks corresponding to the (111) crystal plane were observed as diffraction peaks corresponding to a crystal polymorph of polycrystalline 3C—SiC and no diffraction peak other than the diffraction peaks corresponding to the (111) crystal plane was observed, the rate of growth of the monocrystalline silicon carbide epitaxial growth film 20 was low.

(Measurement Conditions of Rate of Growth of Monocrystalline Silicon Carbide Epitaxial Growth Film 20)

Seed substrate: a silicon carbide substrate with a 4H crystal polymorph,

Pressure of Atmosphere: $10^{-6}$ to $10^{-4}$ Pa, and

Temperature of Atmosphere: 1900° C.

REFERENCE SIGNS LIST

10 . . . vessel
11 . . . feed substrate
11a . . . principal surface
11b . . . support member
11c . . . polycrystalline silicon carbide film
12 . . . seed substrate
12a . . . principal surface
12b . . . support member
12b . . . polycrystalline silicon carbide film
13 . . . silicon melt layer
20 . . . monocrystalline silicon carbide epitaxial growth film

The invention claimed is:

1. A method for epitaxial growth of a monocrystalline silicon carbide using a feed material for epitaxial growth of a monocrystalline silicon carbide, the feed material including a surface layer containing a polycrystalline silicon carbide with a 3C crystal polymorph, wherein upon X-ray diffraction of the surface layer, a diffraction peak corresponding to a (111) crystal plane and a diffraction peak other than the diffraction peak corresponding to the (111) crystal plane are observed as diffraction peaks corresponding to the polycrystalline silicon carbide with a 3C crystal polymorph, and wherein an average crystallite diameter calculated from a first-order diffraction peak observed by X-ray diffraction of the surface layer and corresponding to the polycrystalline silicon carbide with a 3C crystal polymorph is 700 Å or less.

2. The method for epitaxial growth of a monocrystalline silicon carbide according to claim 1, wherein a first-order diffraction peak corresponding to the (111) crystal plane is a main diffraction peak having the highest diffraction intensity among first-order diffraction peaks corresponding to the polycrystalline silicon carbide with a 3C crystal polymorph.

3. The method for epitaxial growth of a monocrystalline silicon carbide according to claim 1, wherein the diffraction peak other than the diffraction peak corresponding to the (111) crystal plane includes at least one diffraction peak, each corresponding to one of a (200) crystal plane, a (220) crystal plane, and a (311) crystal plane.

4. The method for epitaxial growth of a monocrystalline silicon carbide according to claim 3, wherein the diffraction peak other than the diffraction peak corresponding to the (111) crystal plane includes diffraction peaks, each corresponding to one of the (200) crystal plane, the (220) crystal plane, and the (311) crystal plane.

5. The method for epitaxial growth of a monocrystalline silicon carbide according to claim 1, wherein the sum of the intensities of first-order diffraction peaks other than a first-order diffraction peak corresponding to the (111) crystal plane is 10% or more of the sum of the intensities of all the first-order diffraction peaks.

6. The method for epitaxial growth of a monocrystalline silicon carbide according to claim 1, wherein the average crystallite diameter calculated from the first-order diffraction peak observed by X-ray diffraction of the surface layer and corresponding to the polycrystalline silicon carbide with a 3C crystal polymorph is 500 Å or less.

7. The method for epitaxial growth of a monocrystalline silicon carbide according to claim 6, wherein upon X-ray diffraction of the surface layer a first-order diffraction peak corresponding to the (111) crystal plane and at least one first-order diffraction peak each corresponding to one of a (200) crystal plane, a (220) crystal plane, and a (311) crystal plane are observed, and $(I_1/I_0)^{-1} \cdot D^2$ is equal to or smaller than $10^8$ Å$^2$, where:
- I₀ represents the sum of the intensity of the first-order diffraction peak corresponding to the (111) crystal plane and the total intensity of the at least one first-order diffraction peak each corresponding to one of the (200) crystal plane, the (220) crystal plane, and the (311) crystal plane;
- I₁ represents the total intensity of the at least one first-order diffraction peak each corresponding to one of the (200) crystal plane, the (220) crystal plane, and the (311) crystal plane; and
- D represents the average crystallite diameter (Å) calculated from the at least one first-order diffraction peak each corresponding to one of the (200) crystal plane, the (220) crystal plane, and the (311) crystal plane.

8. The method for epitaxial growth of a monocrystalline silicon carbide according to claim 1, wherein the proportion of (111) crystal planes having an orientation angle of 67.5° or more in the (111) crystal planes observed by X-ray diffraction of the surface layer is less than 80%.

9. The method for epitaxial growth of a monocrystalline silicon carbide according to claim 1, wherein an LO peak derived from a polycrystalline silicon carbide with a 3C crystal polymorph is observed upon Raman spectroscopic analysis of the surface layer with an excitation wavelength of 532 nm and the absolute amount of shift of the LO peak from 972 $cm^{-1}$ is less than 4 $cm^{-1}$.

10. The method for epitaxial growth of a monocrystalline silicon carbide according to claim 9, wherein the full width at half-maximum of the LO peak is 7 $cm^{-2}$ or more.

11. The method for epitaxial growth of a monocrystalline silicon carbide according to claim 1, wherein the surface layer contains a polycrystalline silicon carbide with a 3C crystal polymorph in a proportion of 50% by mass or more.

12. The method for epitaxial growth of a monocrystalline silicon carbide according to claim 11, wherein the surface layer contains no ingredient other than the polycrystalline silicon carbide with a 3C crystal polymorph except for impurities.

13. The method for epitaxial growth of a monocrystalline silicon carbide according to claim 1, the feed material including: a support member; and a polycrystalline silicon carbide film formed on the support member and forming the surface layer.

14. The method for epitaxial growth of a monocrystalline silicon carbide according to claim 13, wherein the polycrystalline silicon carbide film has a thickness within a range of 30 μm to 800 μm.

15. The method for epitaxial growth of a monocrystalline silicon carbide according to claim 1, the feed material being formed of a polycrystalline silicon carbide substrate containing a polycrystalline silicon carbide with a 3C crystal polymorph.

16. The method for epitaxial growth of a monocrystalline silicon carbide according to claim 1, wherein the feed material and a seed material including a surface layer containing silicon carbide are heated with the surface layers of the feed material and the seed material facing each other through a silicon melt layer to epitaxially grow a monocrystalline silicon carbide on the surface layer of the seed material.

17. The method for epitaxial growth of a monocrystalline silicon carbide according to claim 12, wherein the content of impurities is 5% by mass or less.

* * * * *